United States Patent [19]

Iida

[11] 4,151,454
[45] Apr. 24, 1979

[54] REMAINING CAPACITY DETECTOR OF A BATTERY

[75] Inventor: Toshiharu Iida, Nagoya, Japan

[73] Assignee: Kabushiki Kaisha Aichi Denkikosakusho, Aichi, Japan

[21] Appl. No.: 832,124

[22] Filed: Sep. 12, 1977

[30] Foreign Application Priority Data

Sep. 20, 1976 [JP] Japan .............................. 51/112670

[51] Int. Cl.² .............................................. H02J 7/00
[52] U.S. Cl. ........................................ 320/48; 320/43; 340/636
[58] Field of Search .......................... 320/48, 40, 43; 340/249, 636

[56] References Cited

U.S. PATENT DOCUMENTS

| | | | |
|---|---|---|---|
| 3,349,386 | 10/1967 | Zug | 320/48 UX |
| 3,895,284 | 7/1975 | Schweizer et al. | 320/48 |
| 4,017,724 | 4/1977 | Finger | 320/48 X |

Primary Examiner—Robert J. Hickey
Attorney, Agent, or Firm—William Anthony Drucker

[57] ABSTRACT

A calibration circuit for charging and discharging is connected between the both terminals of a battery, a memory circuit is connected to the calibration circuit, and an indicator is connected to the memory circuit. The remaining capacity of the battery is shown correctly by the indicator independently of whether the battery is charged, discharged, has been charged or has been discharged.

2 Claims, 3 Drawing Figures

REMAINING CAPACITY DETECTOR OF A BATTERY

BACKGROUND OF THE INVENTION

This invention relates to a means which indicates the remaining capacity of a battery when it is under charge or discharge.

In general, the normal characteristic of a battery cannot be restored by charging after the ampere hour of discharge of the battery amounts to a certain value or more, and the life of the battery is shortened due to the deterioration of the electrodes of the battery. If an overcharge results while charging, it shortens the life of the battery as well. Thus, for the proper treatment of a battery, it is important to know its remaining capacity, to start the charging of the battery, and to stop it at a suitable time. In order to meet this requirement, those devices have been developed which can detect the ampere hour of discharge or of charge. The device to detect the ampere hour of discharge is fixed in a monitoring room for a large installation of electric power source, and is used effectively. The device to detect the ampere hour of charge is also fixed in the same room as a device separate from the previous one, and is used effectively as well.

An object of the present invention lies in detecting the remaining capacity of the battery, whether under charged or discharged, with a means of simple construction by measuring the voltage across the terminals of the battery without taking much time.

Another object of the present invention lies in providing a device for detecting the remaining capacity which can be manufactured as a compact and simply constructed unit, and can be set with ease especially in the restricted space in front of the driver's seat of a battery car and the like.

BRIEF DESCRIPTION OF THE DRAWINGS

In FIG. 1, a load 11 is connected to a battery 10 through a switch $S_1$. This load 11 is, for example, the electric motor to drive a battery car. A charger 12 is also connected to the battery 10 through another switch $S_2$ interchangeably with the load 11. The charger 12 may be connected to the battery 10 through the switch 12 at all times or only at the time of necessary charging.

Figure 1:
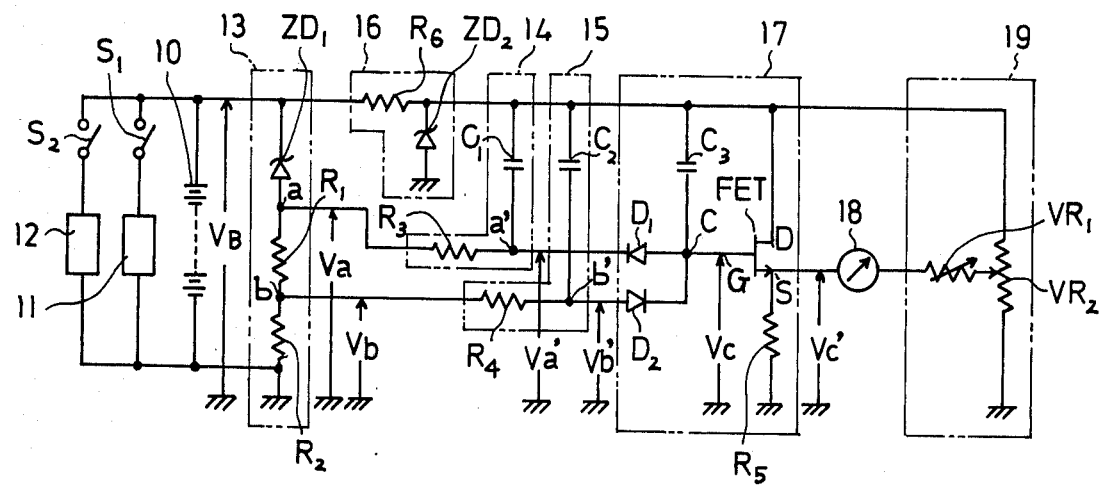
FIG. 1 is the electric circuit diagram of a remaining capacity detector.

A remaining capacity detector connected to the battery 10 is described next. Between the terminals of the battery 10, a calibration circuit for charging and discharging 13 which consists of a voltage regulator diode $ZD_1$ and dividing resistors $R_1$ and $R_2$ connected in series. The output terminals of this calibration circuit are formed at the junction "a" of the diode $ZD_1$ and the dividing resistor $R_1$ and at the junction "b" between the dividing resistors $R_1$ and $R_2$. At these output terminals "a" and "b", the output voltages Va and Vb are obtained respectively. The voltage Va is the voltage across the terminals of the battery 10 minus the breakdown voltage $VZ_1$ of the diode $ZD_1$, and the voltage Vb is divided from the voltage Va. Thus, the variation of the voltage VB is introduced to the terminals of the calibration circuit 13 as a relatively large voltage. The values of the diode $ZD_1$ and the resistors $R_1$ and $R_2$ are determined so that the output voltage Va under discharge of the battery 10 may be equal to the output voltage Vb under charge of the battery 10 if the remaining capacity of the battery 10 under charge is equal to that under discharge. An integrating circuit 14 for charge is connected to the output terminal "a" of the calibration circuit for charging and discharging 13. This integrating circuit 14 consists of a resistor $R_3$ and a condenser $C_1$. The juncture of the resistor $R_3$ and the condenser $C_1$ forms the output terminal "a'" of the integrating circuit 14.

An integrating circuit 15 for charge is connected to the output terminal "b" of the calibration circuit for charging and discharging 13. This integrating circuit 15 consists of a resistor $R_4$ and a condenser $C_2$. The juncture of the resistor $R_4$ and the condenser $C_2$ is the output terminal "b'" of the integrating circuit 15.

A constant-voltage regulated power supply 16 is connected between the both terminals of the battery 10. This constant-voltage regulated power supply 16 consists of a resistor $R_6$ and a voltage regulator diode $ZD_2$, and the juncture of the both impedances is the output terminal to supply electric power to the integrating circuits 14 and 15, and a memory circuit 17 described below.

A memory circuit 17 is connected to the output terminal "a'" of the integrating circuit 14 for discharge and to the output terminal "b'" of the integrating circuit 15 for charge. This memory circuit 17 includes a field effect transistor FET, a memory condenser $C_3$ connected between the gate G and the drain D of the field effect transistor FET, and a resistor $R_5$ connected to the source S of the field effect transistor FET. The other end of the resistor $R_5$ is earthed. The gate G of the field effect transistor FET serves as the input terminal "C" of the memory circuit 17, and is connected to the output terminals "a'" and "b'" through a backward diode $D_1$ and forward one $D_2$ respectively.

One end of an indicator 18 to show the remaining capacity of the battery 10 is connected to the output terminal of the memory circuit 17, that is, the source S of the field effect transistor FET. As this indicator 18, for example, a DC voltmeter is used. The scale of this indicator 18 is graduated in percents (0–100%) in order to know the remaining capacity easily.

A setting circuit for reference voltage 19 is connected to the other end of the indicator 18. This circuit consists of a variable resistor $VR_2$ to adjust the indication of 0%, and another variable resistor $VR_1$ to adjust the indication of 100%.

Next, the operation of the remaining capacity indicator of the above mentioned construcction is described. When this indicator is connected to the battery completely charged, the output terminal "a" of the calibration circuit for charging and discharging gives the difference ($V_B-V_{Z_1}$) between the terminal voltage $V_B$ of the battery 10 and the breakdown voltage $V_{Z_1}$ of the voltage regulator diode $ZD_1$. Further, a voltage equal to the difference ($V_B-V_{Z_1}$) multiplied by the dividing ratio $R_2/R_1+R_2$ of the dividing resistors $R_1$ and $R_2$ appears at the output terminal "b". On the other hand, the potential difference between two terminals of each of the condensers $C_1$ and $C_2$ of the integrating circuits 14 and 15 and the condenser $C_3$ of the memory circuit 17 is zero initially. Namely, the output terminals "a'" and "b'" and the input terminal "c" are at the output voltage of the constant-voltage regulated power supply 16. As the result of this situation, the output voltage $Vc'$ of the memory circuit 17 is approximately at the output voltage of the constant-voltage regulated power supply 16. Next, the condensers $C_1$ and $C_2$ of the integrating circuits 14 and 15 are charged to the output voltages $Va$ and $Vb$ through the resistors $R_3$ and $R_4$ respectively with respective CR time constant. As the result of this charging, the voltages $Va'$ and $Vb'$ of the integrating circuits 14 and 15 become equal to the output voltages $Va$ and $Vb$ of the calibration circuit for charging and discharging 13. ($Va=Va'$ and $Vb=Vb'$) Then a relation that $Va'<Vc$ and $Vb'<Vc$ holds between the output voltages $Va'$ and $Vb'$ and the voltage $Vc$ of the input terminal C, because the voltage $Vc$ at the input terminal C of the memory circuit 17 is equal to the voltage of the constant-voltage regulated power supply 16 at initial state as described above. Thus, the diode $D_1$ becomes conductive (while the diode $D_2$ is still non-conductive) and so the voltage $Vc$ at the terminal C becomes equal to the output voltage $Va'$. Consequently the output voltage $Vc'$ of the memory circuit 17, satisfying the relation that $Vc'=Vc=Va'$, operates the indicator 18. This is the no-load situation and the indicator 18 points to a value more than 100%.

The operation under discharge is described in turn. If the switch $S_1$ is colsed at the situation just described, the battery 10 begins to discharge. Then the terminal voltage $VB$ decreases and the calibration circuit for charging and discharging 13 decrease as well. These decreased output voltages $Va$ and $Vb$ are integrated in the integrating circuits 14 and 15 respectively with the respective CR time constant. Then the output voltage $Va'$ of the integrating circuit 14 falls gradually and becomes equal to said decreased output voltage $Va$ ($Va=Va'$), for example, after several minutes.

In a similar manner, the output voltage $Vb'$ of the integrating circuit 15 falls gradually, and becomes equal to the decreased output voltage $Vb$, for example, after several seconds ($Vb=Vb'$). As the output voltage of the integrating circuit 14 falls in this manner, $Vc$ becomes larger than $Va'$, and so the diode $D_1$ becomes conductive to make the voltage $Vc$ equal to the voltage $Va'$. Thus, the output voltage $Vc'$ of the memory circuit 17 comes to satisfy the relation that $Vc'=Vc=Va'$. The indicator 18 points to the remaining capacity of 100%. In this case, the diode $D_2$ remains non-conductive as the relation that $Vb'<Vc$ holds still between the output voltage $Vb'$ of the integrating circuit 15 and the voltage at the terminal C.

As the battery 10 continues to discharge, the terminal voltage $VB$ decreases gradually. Due to the operation similar to that mentioned above, the indication of the indicator 18 decreases gradually from 100% towards 0%.

In this phase of discharge, let the load 11 be, for example, a battery car. When the battery car starts to be driven, or is accelerated rapidly in running, a large transient current flows out from the battery 10, lowering the terminal voltage $VB$ abruptly. However, the output voltage $Va'$ of the integrating circuit 14 decreases gradually even if the terminal voltage $VB$ is decreased suddenly. This is because the CR time constant of the integrating circuit 14 is set at a value large enough (for example several minutes) for said large transient current to be damped to a steady current. Thus, the memory circuit 17 does not memory a too small transient voltage of the battery 10, but instead a voltage approximately in proportion to the terminal voltage $VB$ with an average discharge current. The indicator 18 is not affected by the sudden decrease of the transient terminal voltage $VB$, and indicates always the appropriate remaining capacity of the battery 10. After the battery continues to discharge further the terminal voltage $VB$ of the battery 10 decreases to a minimum discharge voltage. Then, also the output voltage $Vc'$ takes a corresponding value as the result of the operation described above, and the indicator 18 points to 0% of remaining capacity.

If the switch $S_1$ is opened during discharging the operation is as follows. When the battery 10 is turned from load state to no-load state, the terminal voltage of it increases slightly. Accordingly, slight increase results also in the output voltages $Va$ and $Vb$ of the calibration circuit for charging and discharging 13, and in the output voltages $Va'$ and $Vb'$ of the integrating circuits 14 and 15. At this time, both the diodes $D_1$ and $D_2$ of the memory circuit 17 become non-conductive as the relation that $Va'>Vc$ and $Vb'<Vc$ holds between the slightly increased voltages $Va'$ and $Vb'$, and the voltage $Vc$ at the terminal C of the memory circuit 17. Thus, neither the voltage $Vc$ at the input terminal C nor the output voltage $Vc'$ changes. Subsequently the indicator 18 maintains its indication before the opening of the switch $S_1$.

The operation of the indicator 18 is described for the case when the battery 10 having been discharged to its remaining capacity of 0% is charged. The battery 10 is charged by the charger 12 when the switch $S_1$ is opened and the switch $S_2$ closed. The terminal voltage $VB$ of the battery 10 increases on account of this charging. Also the output voltages $Va$ and $Vb$ of the calibration circuit for charging and discharging 13 increase with the increase of the voltage $VB$. The output voltages $Va'$ and $Vb'$ of the integrating circuits 14 and 15, whose input voltages are the increasing voltages $Va$ and $Vb$ respectively, increase with the respective CR time constant untill the relation that $Va=Va'$ and $Vb=Vb'$ is established. When the relation that $Vb'>Vc$ is established between the output voltage $Vb'$ and the voltage $Vc$ at the input terminal C of the memory circuit 17, the diode $D_2$ becomes conductive. Then the condenser $C_3$ is charged through the diode $D_2$, and the voltage $Vc$ at the input terminal C comes to satisfy the condition that $Vc=Vb'$. As the output voltage $Vb'$ of the integrating circuit 15 increases hereafter, the voltage at the input terminal C and the output voltage $Vc'$ of the memory circuit 17 increase. Thus, the indicator 18 points to the scale continuously from 0% towards 100% of remaining capacity. When the indicator 18 points to 100% the charging of the battery is completed.

It is now described how the indicator 18 operates when the charging of the battery 10 is interrupted. As the result of the interruption of charging, the terminal voltage $VB$ of the battery 10 decreases somewhat and then settles. With this decrease of the voltage $VB$, the output voltages $Vb$ and $Vb'$ of the calibration circuit for charging and discharging 13 decrease, and also the output voltages $Va'$ and $Vb'$ of the integrating circuits 14 and 15 decrease until they become equal to said output voltages $Va'$ and $Vb'$ respectively. Then, the relation that $Va'>Vc$ holds between the output voltage $Va'$ of the integrating circuit 14 and the voltage $Vc$ at the input terminal C of the memory circuit 17, and the relation that $Vb'<Vc$ between the output voltage $Vb'$ of the integrating circuit 15 and the voltage $Vc$. Thus, both the diodes $D_1$ and $D_2$ become non-conductive, and the voltage at the input terminal C of the memory circuit 17 and the output voltage Vc' remain unchanged. Accordingly, the indicator 18 still continues to show the correct value of remaining capacity before the interruption of charging.

Figure 2:
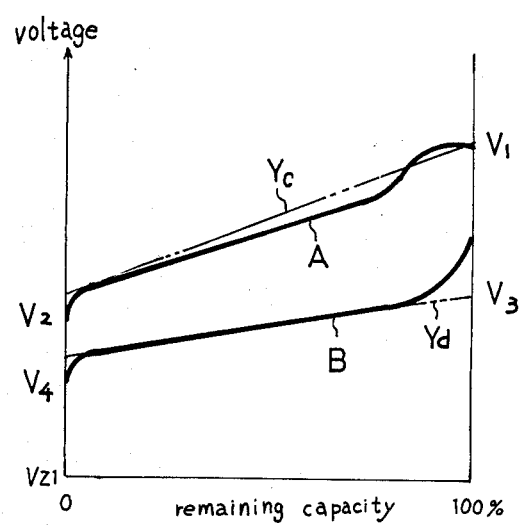
FIG. 2 is a view showing the charge-discharge characteristic of the battery.

Next, referring to FIG. 2, there is described the determining of values of the voltage regulator diode $ZD_1$ and the dividing resistors $R_1$ and $R_2$ in the calibration circuit for charging and discharging 13 shown in FIG. 1. Now let the charge characteristic curve and the discharge characteristic curve of the battery 10 be represented respectively by curves A and B showing a relation between voltage and remaining capacity. If this charge characteristic curve is represented approximately by a straight line, the equation of the straight line is $$Yc = V_1 - V_2 \chi / 100 + V_2 \quad (1)$$

where $V_1$ is the terminal voltage of the battery 10 under charge with the remaining capacity of 100%, and $V_2$ the terminal voltage with the remaining capacity of 0%. In a similar manner, the equation of the straight line representing the discharge characteristic curve approximately is written as $$Yd = V_3 - V_4 \chi / 100 + V_4 \quad (2)$$

where $V_3$ is the terminal voltage of the battery 10 under discharge with the remaining capacity of 100%, and $V_4$ the terminal voltage under discharge with the remaining capacity of 0%.

Then, a proportional constant $\alpha$ and the breakdown voltage $V_{z1}$ of the voltage regulator diode $ZD_1$ are chosen so that they may satisfy two equations $$(V_1 - V_2) = \alpha(V_3 - V_4) \quad (3)$$

and $$(V_2 - V_{z1}) = \alpha(V_4 - V_{z1}) \quad (4)$$

The values of the dividing resistors $R_1$ and $R_2$ are determined so that the proportional constant $\alpha$, the output voltage Va at the output terminal "a", and the output voltage Vb at the output terminal "b" may satisfy the relation that $Va = \alpha Vb$.

An example of the procedure to select the voltage regulator diode $ZD_1$ and to determine the values of the dividing resistors $R_1$ and $R_2$ is explained for the case of a lead battery with a nominal voltage of 12V and a nominal capacity of 100 ampere-hours. The capacity of this lead battery is first discharged in 5 hours and the discharge characteristic curve B is drawn. Such portion of this discharge characteristic curve just obtained that is to be represented by a straight line is extrapolated and the terminal voltage $V_4$ under discharge with the remaining capacity of 0% and the terminal voltage $V_3$ under discharge with the remaining capacity of 100% are read. Assume that it is obtained that $V_4 = 10V$ and $V_3 = 12V$. Then the terminal voltage $V_2$, on the charge characteristic curve A, under charge with the remaining capacity of 0% and the terminal voltage $V_1$ under charge with the remaining capacity of 100% are measured. In this case, if it takes 10 hours for the charger to give the capacity of 100 ampere-hours, the battery is charged for 12 hours with a charging current of 10A (for an assumed charging efficiency of 80%). The terminal voltage of the battery thus charged is measured as the terminal voltage $V_1$ with the remaining capacity of 100%. The terminal voltage of the battery 10 just before charging is measured as the terminal voltage $V_2$ with the remaining capacity of 0%. Assume that the result of the measurement is that $V_2 = 12V$ and $V_1 = 16V$.

Next, the proportional constant $\alpha$ is obtained. The measured terminal voltages $V_1 = 16V$ and $V_2 = 12V$ under charge, and $V_3 = 12V$ and $V_4 = 10V$ under discharge are substitute into equation (3). Namely, from the equations, $$(V_1 - V_2) = \alpha(V_3 - V_4)$$

and $$(16 - 12) = \alpha(12 - 10)$$

the solution $\alpha = 2$ is obtained.

Further, the breakdown voltage $V_{z1}$ of the voltage regulator diode $ZD_1$ is obtained. From the equation, $$(V_2 - V_{z1}) = \alpha(V_4 - V_{z1})$$

and $$(12 - V_{z1}) = \alpha(10 - V_{z1}),$$

the solution $V_{z1} = 8V$ is obtained. Namely it is appropriate to select a volatage regulator diode $ZD_1$ with a breakdown voltage of 8V as the diode $ZD_1$.

The dividing resistors $R_1$ and $R_2$ are determined as follows. The output voltages Va and Vb at the terminals "a" and "b" respectively are given by equations $$Va = (VB - V_{z1})$$

and $$Vb = (VB - V_{z1})(R_2 / R_1 + R_2)$$

Using the relation that $Va = \alpha Vb$, Va and Vb are eliminated from the above two equations, and the resulting equation is $$R_1 + R_2 / R_2 = \alpha = 2.$$

the solution is $R_1 = R_2$. Namely the diving resistors $R_1$ and $R_2$ are selected so that they may be equal to each other.

The output voltages Va' an Vb' of the integrating circuits 14 and 15 are averaged values of the output voltages Va and Vb of the calibration circuit for charging and discharging 13 according to the integrals $$Va' = \frac{1}{T_1} \int_0^{T_1} Va\, dt \quad (5)$$

and $$Vb' = \frac{1}{T_2} \int_0^{T_2} Vb\, dt \quad \text{respectively.} \quad (6)$$

The time intervals $T_1$ and $T_2$ for averaging in equations (5) and (6) are related to the CR time constant of the condenser $C_1$ and the resistor $R_3$, and that of the condenser $C_2$ and the resistor $R_4$.

The time intervals $T_1$ and $T_2$ are selected in accordance with the load 11 connected to the battery 10. For example, the time interval $T_1$ of the integrating circuit 14 is determined as follows. Let the load 11 be an electric motor driving a battery car and the like. The large transient current flowing at the time of the start or the acceleration of the battery car is damped to a steady current in about several seconds. However, if the time interval $T_1$ is put to the order of magnitude of several seconds, the averaging to obtain the voltage $V_a'$ is completed before the restoration of the transient current to the steady current when the start or the acceleration of the battery car is repeated several times in succession. Then, the output voltage $V_a'$ may not be considered as the voltage proportional to the terminal voltage $V_B$ of the battery 10 which is discharged equivalently with an average discharge current. Thus, in order to eliminate this inconvenience, the time interval $T_1$ is put preferably to the order of magnitude of several minutes.

The output voltage $V_b$ under charge is influenced by the large transient current less than that under discharge is. Thus, the time interval $T_2$ for the integrating circuit 15 can be put to several seconds, during which the terminal voltage $V_3$ of the battery 10 under charge is averaged meaningfully.

The output voltage of the constant-voltage regulated power supply 5 is preferably maintained as a stable voltage even if the terminal voltage $V_B$ of the battery 10 decreases considerably. Thus, this output voltage is selected to be lower than the terminal voltage $V_4$ of the battery 10 under discharge with the remaining capacity of 0%. The breakdown voltage $V_{Z2}$ of the voltage regulator diode $ZD_2$ is selected so that this magnitude of the voltage of the power supply 5 may be obtained. An example of the value of the voltage $V_{Z2}$ is selected to be approximately equal to the breakdown voltage $V_{Z1}$ of the voltage regulator diode $ZD_1$.

Figure 3:
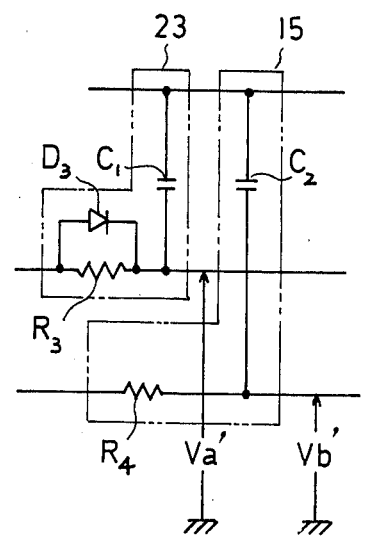
FIG. 3 is the electric circuit diagram for a different example of the integrating circuit.

Referring to FIG. 3, a modified integrating circuit for discharge 23 is described which can be used in the detector shown in FIG. 1. A resistor $R_3$ is connected in parallel with a diode $D_3$ as shown. The integrating circuit 23 with the diode 3 non-conductive has the integrating operation same as in the previous embodiment when the voltage at the terminal "a" is decreasing. When the output voltage $V_a$ at the terminal "a" is increasing on the contrary, the diode $D_3$ is conductive, and the condenser $C_1$ is discharged at the same rate as the output voltage $V_a$ increases. Subsequently the output voltage at the terminal "a" remains the voltage of the battery being discharged equivalently in an averaged manner even if the instantaneous terminal voltage of the battery 10 rises or falls abruptly due to the energization or the deenergization of the load taking place frequently. Thus, the indicator 18 can show the remaining capacity of the battery 10 more appropriately.

What I claim is:

1. A remaining capacity detector, for a battery, comprising:
    (i) a calibration circuit for charging and discharging, said calibration circuit being connected to the terminals of said battery and adapted to change the terminal voltage of the battery into an output corresponding to the remaining capacity of the battery under charge or discharge,
    (ii) a memory circuit connected to said calibration circuit and adapted to memory the output of said calibration circuit,
    (iii) integrating circuit means interposed between said calibration circuit and said memory circuit and adapted to integrate the output of said calibration circuit, said integrating circuit means consisting of an integrating circuit for discharge with a longer time constant, and of an integrating circuit for charge with a shorter time constant, and,
    (iv) an indicator connected to the terminals of said memory circuit and adapted to show the remaining capacity of said battery.

2. A remaining capacity detector, as claimed in claim 1, wherein said calibration circuit consists of a voltage regulator diode, a first dividing resistor, and a second dividing resistor, and wherein said integrating circuit for discharge is connected to the junction of said voltage regulator diode and said first dividing resistor, said integrating circuit for charge being connected to the junction of said first and second dividing resistors.

* * * * *